US012581753B2

(12) United States Patent 
Park et al.

(10) Patent No.: US 12,581,753 B2 
(45) Date of Patent: Mar. 17, 2026

(54) MANUFACTURING METHOD OF IMAGE SENSOR

(71) Applicant: Samsung Electronics Co., Ltd., Suwon-si (KR)

(72) Inventors: Hyeyeon Park, Suwon-si (KR); Boseong Kim, Suwon-si (KR); Yunki Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 442 days.

(21) Appl. No.: 18/130,014

(22) Filed: Apr. 3, 2023

(65) Prior Publication Data

US 2023/0361150 A1 Nov. 9, 2023

(30) Foreign Application Priority Data

May 9, 2022 (KR) ........................ 10-2022-0056678

(51) Int. Cl. 
*H10F 39/00* (2025.01)

(52) U.S. Cl. 
CPC ....... *H10F 39/024* (2025.01); *H10F 39/8053* (2025.01)

(58) Field of Classification Search 
CPC ........................... H10F 39/024; H10F 39/8053 
See application file for complete search history.

(56) References Cited

U.S. PATENT DOCUMENTS

| | | | | |
|---|---|---|---|---|
| 7,524,592 B2 * | 4/2009 | Wu | ........................... | G03F 1/36 |
| | | | | 430/7 |
| 7,884,435 B2 * | 2/2011 | Jun | ........................... | G03F 1/70 |
| | | | | 348/274 |
| 10,923,518 B2 * | 2/2021 | Kim | .................... | H10F 39/8053 |
| 2005/0284393 A1 | 12/2005 | Chen et al. | | |
| 2007/0134565 A1 * | 6/2007 | Kang | .................... | G02B 5/201 |
| | | | | 430/7 |
| 2008/0137207 A1 | 6/2008 | Jun | | |
| 2014/0239431 A1 | 8/2014 | Miyashita | | |
| 2016/0099270 A1 | 4/2016 | Hsu et al. | | |
| 2025/0169214 A1 * | 5/2025 | Ando | .................. | H10F 39/8053 |
| 2025/0351603 A1 * | 11/2025 | Wang | .................... | H10F 39/807 |

FOREIGN PATENT DOCUMENTS

| | | | |
|---|---|---|---|
| JP | 2005-173384 A | 6/2005 |
| JP | 4998334 B2 | 8/2012 |
| JP | 2013-161848 A | 8/2013 |
| JP | 5446098 B2 | 3/2014 |

(Continued)

*Primary Examiner* — David A Zarneke 
(74) *Attorney, Agent, or Firm* — Muir Patent Law, PLLC

(57) ABSTRACT

A manufacturing method of an image sensor includes, operations of: forming a color filter layer over a plurality of pixel regions having a plurality of photodetectors and arranged in a matrix on a substrate, and patterning the color filter layer with a mask including patterns disposed adjacently in a diagonal direction of the matrix, to form color filters for some of the plurality of pixel regions on the substrate. Each of the patterns may include a rectangular main pattern and sub-patterns outwardly extending from corners of the main patterns. Sizes of sub-patterns of different adjacent patterns that face each other may have sizes that are smaller than other sub-patterns of the adjacent patterns.

20 Claims, 22 Drawing Sheets

(56)  References Cited

FOREIGN PATENT DOCUMENTS

| KR | 10-2006-0077709 | A | 7/2006 |
| KR | 10-0862855 | B1 | 10/2008 |
| KR | 10-2008-0113488 | A | 12/2008 |
| KR | 10-2010-0041388 | A | 4/2010 |
| KR | 10-2010-0054954 | A | 5/2010 |
| KR | 10-2019-0095630 | A | 8/2019 |
| KR | 10-2022-0001702 | A | 1/2022 |

* cited by examiner

A

B

MANUFACTURING METHOD OF IMAGE SENSOR

CROSS-REFERENCE TO RELATED APPLICATIONS

This application claims benefit of priorities to Korean Patent Application No. 10-2022-0056678 filed on May 9, 2022 in the Korean Intellectual Property Office, the disclosure of which is incorporated herein by reference in its entirety.

BACKGROUND

1. Field

The present inventive concept relates to a manufacturing method of an image sensor, image sensors made by the manufacturing method and photomasks used to manufacture the image sensor.

2. Description of Related Art

An image sensor for capturing an image and converting the image into an electrical signal is widely used not only in various electronic devices such as digital cameras, mobile phone cameras, and portable camcorders, but also in cameras mounted on automobiles, security devices, and robots. Since such an image sensor should minimize deviation in image quality while also satisfying requirements for miniaturization and high resolution, various studies are being conducted to make light captured by pixels constituting the image sensor uniform to address this demand.

SUMMARY

An aspect of the present inventive concept is to provide an image sensor having improved color uniformity by making received light uniform.

According to an aspect of the present inventive concept, a manufacturing method of an image sensor comprises the steps of preparing a substrate including a plurality of pixel regions arranged in a matrix, each pixel region having a photodetector; forming a color filter layer on the substrate; and patterning the color filter layer using a photolithography mask to form first color filters for some of the plurality of pixel regions on the substrate. The mask may include patterns respectively corresponding to the first color filters, the patterns including a first pattern and a second pattern disposed immediately adjacent to each other in a diagonal direction with respect to the matrix. Each of the patterns may include a rectangular main pattern and sub-patterns extending outwardly from each corner of the main pattern, wherein the sub-patterns include first sub-patterns and second sub-patterns, and wherein corners of the first pattern and corners of the second pattern comprise first corners that do not face each other and second corners that face each other, wherein the first corners comprise first sub-patterns and the second corners comprise second sub-patterns, and wherein the second sub-patterns are smaller than the first sub-patterns.

According to an aspect of the present inventive concept, a manufacturing method of an image sensor comprises the steps of preparing a substrate including a plurality of pixel regions arranged in a matrix, each pixel region having a photodetector; forming a first color filter layer on the substrate; patterning the first color filter layer using a first photolithography mask, to form first color filter structures corresponding to a first group of the plurality of pixel regions on the substrate; forming a second color filter layer covering the first color filter structures on the substrate; and patterning the second color filter layer using a second photolithography mask, to form second color filter structures corresponding to a second group of the plurality of pixel regions on the substrate. The first photolithography mask may include first patterns disposed in a region respectively corresponding to the first color filters, and the second photolithography mask may include second patterns disposed in a region respectively corresponding to the second color filters, wherein at least one first pattern, among the first patterns, has each of its corners disposed immediately adjacent, in a corresponding diagonal direction of the matrix, to a corner of another corresponding one of the first patterns, wherein the second patterns comprise a pair of immediately adjacent second patterns having corners facing each other in a corresponding diagonal direction of the matrix, wherein each of the first patterns comprises a first main pattern and sub-patterns extending outwardly from each corner of the first main pattern and each of the second patterns comprises a second main pattern and sub-patterns extending outwardly from each corner of the second main pattern, the first and second main patterns having a rectangular shape, and wherein the facing corners of the pair of immediately adjacent second patterns have sub-patterns that have a size that is smaller than a size of at least some of the sub-patterns of the first patterns.

According to an aspect of the present inventive concept, a manufacturing method of an image sensor comprises the steps of forming a color filter layer over a plurality of pixel regions having a plurality of photodetectors that are arranged in a matrix on a substrate; and patterning the color filter layer with a photolithography mask including patterns disposed adjacently in a diagonal direction of the matrix, to form color filters at corresponding to ones of the plurality of pixel regions on the substrate. Each of the patterns may include rectangular main patterns and sub-patterns outwardly extending from each corner of the main patterns. The patterns may comprise a pair of immediately adjacent patterns having corners facing each other that do not have sub-patterns and are the corners of the corresponding main patterns or have sub-patterns having a size smaller than a size of other sub-patterns of the pair of immediately adjacent patterns other than the sub-patterns of the corners facing each other.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1:
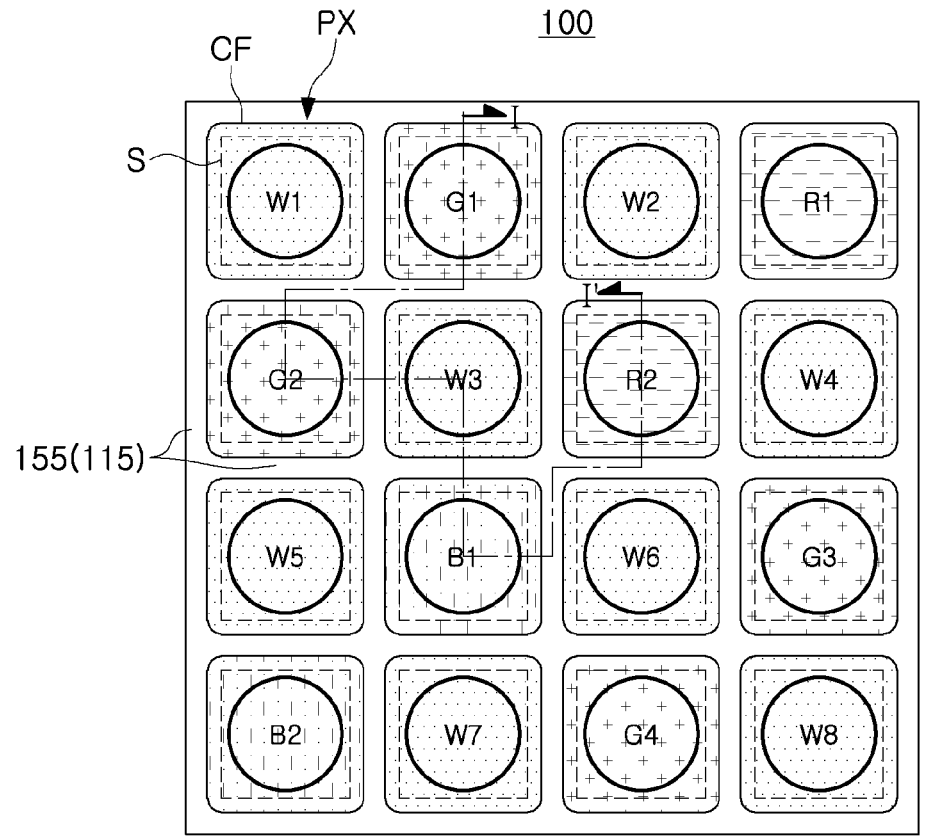
FIG. 1 is a plan view illustrating an image sensor according to an example embodiment of the present inventive concept.
Figure 2:
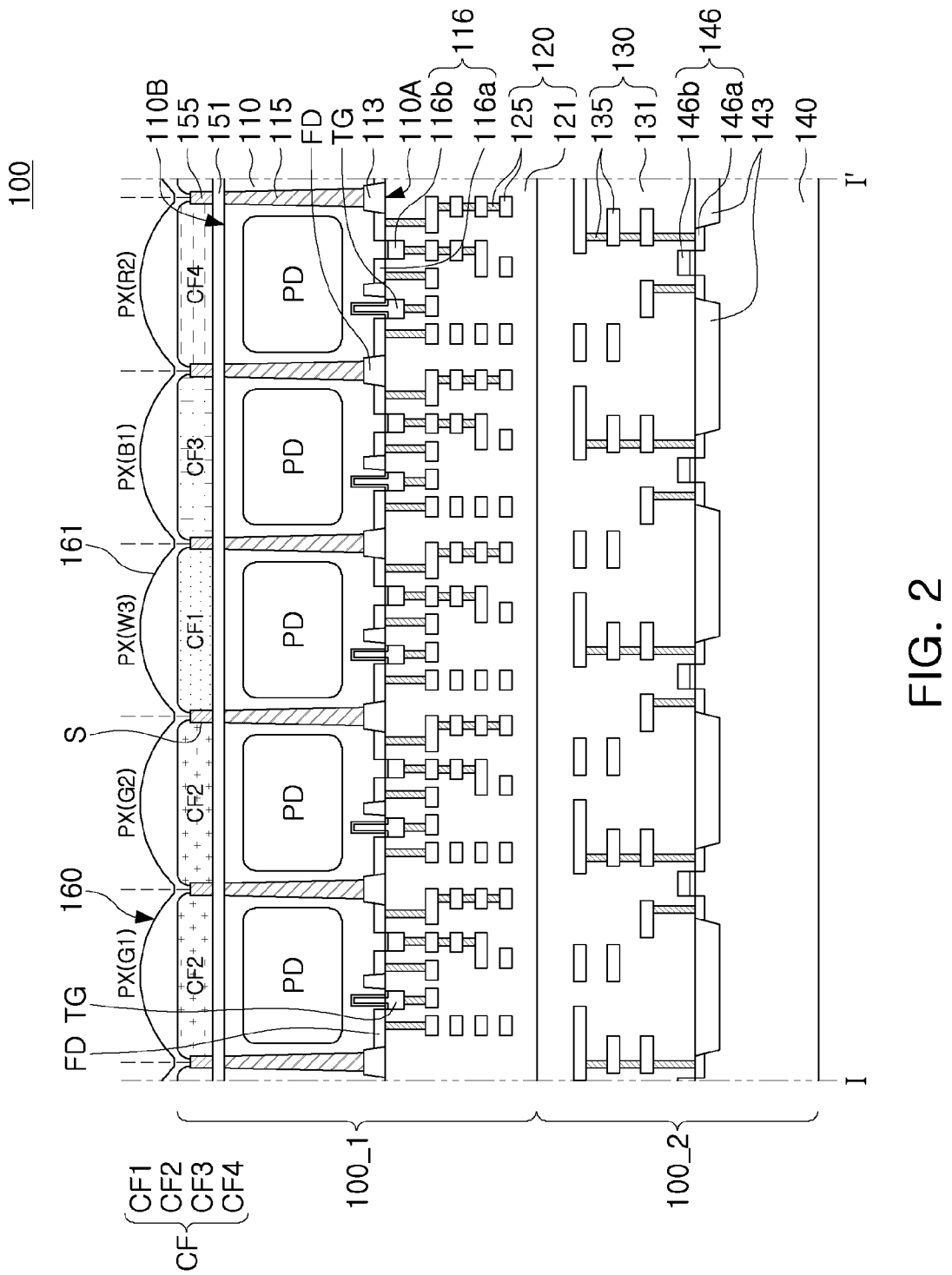
FIG. 2 is a cross-sectional view of the image sensor of FIG. 1 taken along line I-I'.

FIG. 1 is a plan view illustrating an image sensor according to an example embodiment of the present inventive concept, and FIG. 2 is a cross-sectional view of the image sensor of FIG. 1 taken along line I-I'. It should be appreciated that certain portions of the figures may be simplified for ease of description, such as spacing between certain pixels PX and simplified circuitry representations in the cross section of FIG. 2.

Referring to FIGS. 1 and 2, an image sensor 100 according to an example embodiment may include a first chip 100_1 and a second chip 100_2 disposed on the first chip 100_1. Each of the first chip 100_1 and the second chip 100_2 may comprise a substrate (first substrate 110 and second substrate 140), such as a crystalline semiconductor (Si, SiGe, Ge, etc.) substrate in and on which are formed various circuits (e.g., transistors and logic gates formed of interconnections of such transistors). The first substrate 110 of the first chip 100_1 includes a plurality of pixel regions PX arranged in a matrix structure. FIG. 1 illustrates an example in which the plurality of pixel regions PX are arranged in four rows and four columns, but the present inventive concept is not limited thereto—the number of rows and columns of the plurality of pixel regions PX may be variously modified and the structure of FIG. 1 may represent a portion of the image sensor 100 whose structure is repeated to form the image sensor with significantly more rows and columns of pixel regions PX. In addition, the image sensor 100 according to an example embodiment may be an RGBW image sensor including red pixels R1 and R2, green pixels G1, G2, G3, and G4, blue pixels B1 and B2, and white pixels, W1, W2, W3, W4, W5, W6, W7, and W8, but the inventive concept is not limited thereto. Each of the plurality of pixel regions PX may generate image data, and each of the plurality of pixel regions PX may be provided with a corresponding dedicated microlens 161. In other examples, several pixel regions PX may share a corresponding microlens 161.

Referring to FIG. 2, as described above, the image sensor 100 may include a first chip 100_1 and a second chip 100_2. The first chip 100_1 may be an image sensor chip in which a plurality of pixel regions PX are arranged, and the second chip 100_2 may be a logic semiconductor chip. In this specification, the first chip 100_1 also may be referred to as and considered to be an image sensor.

In an example embodiment, the second chip 100_2 includes a second substrate 140 and a second interconnection structure 130 disposed on the second substrate 140. The second substrate 140 includes device isolation regions 143 defining active regions, and second individual devices (e.g., circuits, such one or more interconnected logic gates) 146 formed on the active region, and the second individual devices 146 may constitute a logic circuit for image processing, and may include, for example, interconnected transistors with the transistors having impurity regions 146a serving as a source/drain and a gate structure 146b.

The second interconnection structure 130 may include a second insulating layer 131 and a second multilayer interconnection 135 formed in the second insulating layer 131 and connected to the second individual devices 146. The second multilayer interconnection 135 may include a plurality of interconnection layers located on different height levels, and vias electrically connecting plurality of interconnection layers and the second individual elements 146.

The first chip 100_1 may include a first substrate 110 having a first surface 110A and a second surface 110B positioned opposite to each other, and a first interconnection structure 120 disposed on the first surface 110A of the first substrate 110. The first substrate 110 may include a device isolation pattern 115 defining pixel regions PX, and photodetectors PD disposed in each of the pixel regions PX. For example, the photodetectors PD (e.g., a photodiode) may generate and accumulate charges in proportion to an amount of light incident from the second surface 110B of the first substrate 110. The first photodetectors PD may be formed in the first substrate 110.

The first substrate 110 may include a device isolation regions disposed on and/or within the first surface 110A to define active regions of the first substrate 110. FIG. 2 illustrates a transfer gate TG and a floating diffusion region FD disposed on an active region, and first individual devices 116 formed on the active region, together with the photodetectors PD. The first individual devices 116 may include one or more transistors, each transistor having impurity regions 116a (e.g., doped regions of the first substrate 110) serving as source/drains and a gate structure 116b. Such transistors may include a reset transistor, a selection transistor, and a source follower transistor. The first interconnection structure 120 may include a first insulating layer 121 and a first multilayer interconnection 125 formed in the first insulating layer 121 and connected to the first individual elements 116.

The image sensor 100 according to an example embodiment may include an insulating film 151, color filter structures CF, and a microlens layer 160, sequentially disposed on the second surface 1101B of the first substrate 110. The insulating film 151 may be configured to cover the second surface 110B of the first substrate 110 between the second surface 110B of the first substrate 110 and the color filter structures CF. The insulating film 151 may be or include an anti-reflection film.

A light blocking pattern 155 may be disposed on the insulating film 151 to define pixel regions PX. The light blocking pattern 155 may define spaces for disposing the color filter structures CF. The light blocking pattern 155 may vertically overlap the device isolation pattern 115 (which may also define pixel regions PX). The light blocking pattern 155 may not vertically overlap the photodetector PD in the pixel regions PX. For example, the light blocking pattern 155 may include a metal such as tungsten.

The color filter structures CF may be respectively disposed in spaces defined by the light blocking pattern 155 to provide pixel regions PX for image sensing. The color filter structures CF may include a white color filter structure CF1, a green color filter CF2, a blue color filter CF3, and a red color filter CF4. It should be appreciated that the white color filter structure CF1 may be formed of a transparent material to allow all visible light to pass through. For example, a white color filter structure may not include any visible light filtering element (e.g., no added pigment or dye) or may only have minor filtering elements therein (intentionally or unintentionally) that may adjust the hue of the white light. In some examples, the transparent material forming the white color filter structure may be (but need not be) the same as that used to form the color filters, such as by adding a corresponding pigment/dye to the transparent material. The color filters described herein, such as the green color filter CF2, the blue color filter CF3, and the red color filter CF4 are also color filter structures CF block certain portions of the visible light spectrum and allow other light (e.g., green, blue and red light) to pass therethrough. Like the white color filter structure, these color filters may also be considered color filter structures. Thus, for ease of explanation, "color filter structure" is used herein to refer generically to one or several of the white color filter structure (e.g., CF1) and the color filters (e.g., green color filter CF2, blue color filter CF3, and/or red color filter CF4). In an example embodiment, each of the color filter structures CF may vertically overlap one photodetector PD disposed in one pixel region PX. Each of the color filter structures CF may transmit light of a specific wavelength different from each other, and the photodetector PD positioned therebelow may generate electric charges from the light of a specific wavelength.

As shown in FIG. 1, the color filter structures CF may be arranged in an RGBW-Kodak type pattern, comprising a two dimensional matrix of color filter structures arranged and rows and columns. However, the present inventive concept is not limited thereto. Each corner of the white color filter structure CF1 according to an example embodiment may be arranged to face corners of other white color filter structures, adjacent to each other, in a diagonal direction of the matrix. In the present specification, such an arrangement is defined as a 'symmetric arrangement'. On the other hand, the green color filter CF2, the blue color filter CF3, and the red color filter CF4 may be arranged so that each of corners faces one or two corners of each of the corners of the color filter having the same color in the diagonal direction of the matrix. In the present specification, such an arrangement is defined as an 'asymmetrical arrangement'. Color filters having an asymmetrical arrangement are aligned in one direction in a diagonal direction. In a process of manufacturing a color filter, the color filters having an asymmetrical arrangement may have the same color and may cause a defect in which corners of color filters, adjacent to each other, are connected to each other. As described above, when the color filters having an asymmetrical arrangement are connected to each other, a problem of increasing deviation of light emitted from each of the color filters having a symmetric arrangement may occur. The image sensor 100 according to an example embodiment has an advantage in that color filters having an asymmetrical arrangement are prevented from being connected to each other in the process of manufacturing a color filter, so that deviation of light of color filters having a symmetric arrangement may be reduced. This will be described in detail in a method of manufacturing an image sensor to be described later.

The microlens layer 160 includes microlenses 161 disposed to respectively correspond to the color filter structures CF. The microlenses 161 may have an upwardly convex shape (e.g., a hemispherical shape) and may have a predetermined radius of curvature. Each microlens 161 may comprise a collimating lens or other focusing lens. The microlenses 161 may change a path of light incident to the image sensor to focus the light (e.g., on a corresponding photodetector PD). For example, the microlens layer 160 may be formed of a transparent resin.

FIGS. 3 to 16 are cross-sectional views regarding a method of manufacturing an image sensor according to an example embodiment of the present inventive concept and may be used to manufacture the image sensor 100 illustrated in FIGS. 1 and 2. In an example embodiment, a case in which the white color filter structure CF1, the green color filter CF2, the blue color filter CF3, and the red color filter CF4, are sequentially formed is illustrated as an example, but an order of forming the color filter structures may be variously changed.

Figure 3:
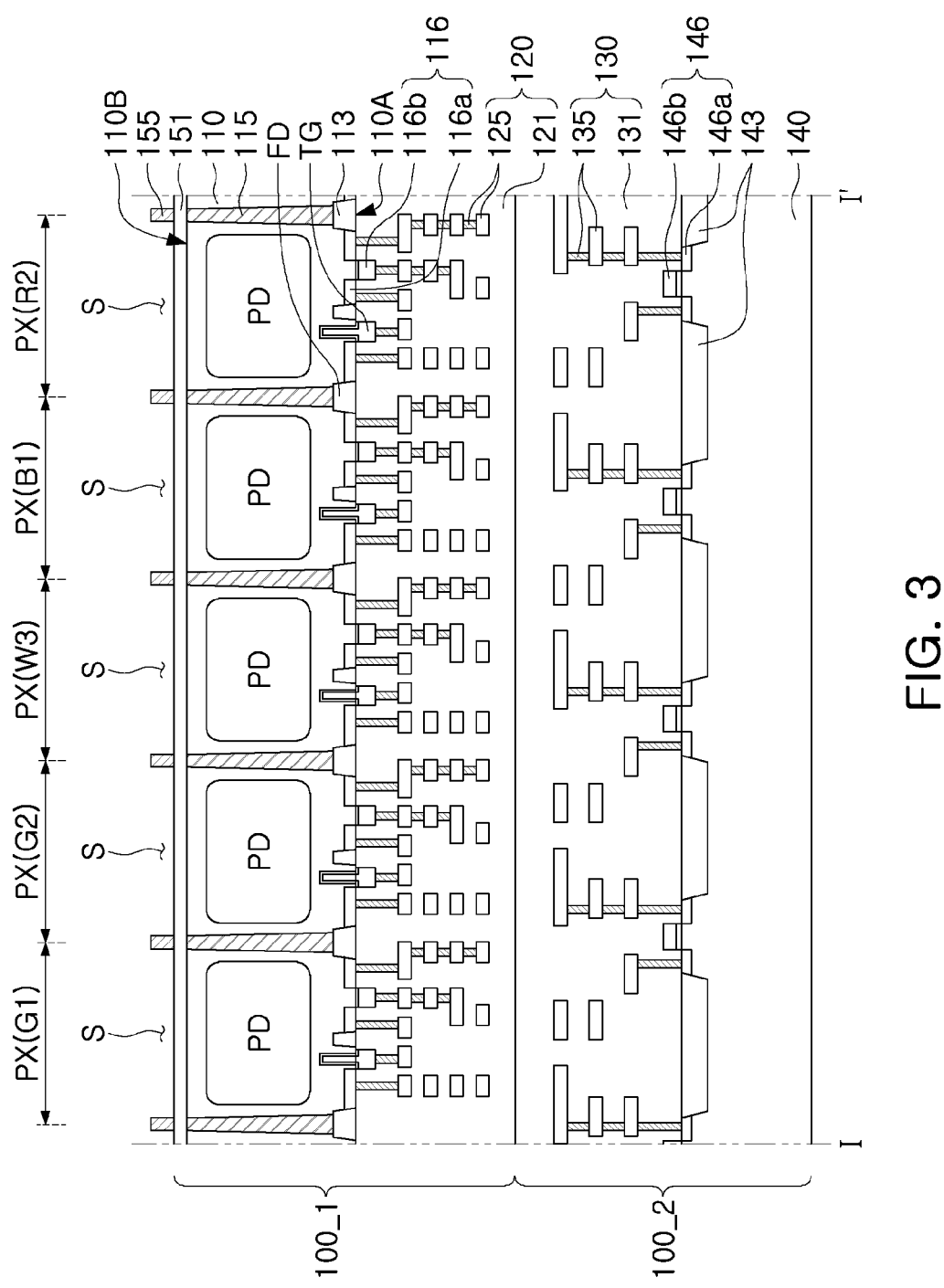
FIGS. 3 to 16 are cross-sectional views regarding a manufacturing method of an image sensor according to an example embodiment of the present inventive concept.

First, referring to FIG. 3, after bonding a first wafer for the first chip 100_1 and a second wafer for the second chip 100_2, an insulating film 151 and a light blocking pattern 155 are formed on the second surface 110B of the first substrate 110.

This bonding process may be implemented as a wafer level process. In an example embodiment, the first and second substrates 110 and 140 may be understood as wafers. The first substrate 110 may be doped with first conductivity-type impurities, and second conductivity-type impurities may be implanted into the first substrate 110 to form photodetectors PD. A device isolation portion 113 may be formed on the first surface 110A of the first substrate 110, and a device isolation pattern 115 may be formed in the device isolation portion 113 to a predetermined depth to define pixel regions PX. For example, the device isolation pattern 115 may include polysilicon. A floating diffusion region FD, a transfer gate TG, and various transistors may be formed on the first surface 110B of the first substrate 110, to generate an image signal. A first wafer for the first chip 100_1 may be manufactured by forming a first interconnection structure 120 on the first surface 110B of the first substrate 110. The manufactured first wafer may be bonded on a second wafer for the second chip 100_1 for a logic circuit.

The light blocking pattern 155 may be disposed on the insulating film 151 to define the pixel regions PX1 and PX2. The light blocking pattern 155 may be a black matrix and define spaces S for disposing the color filter structures CF1, CF2, CF3, CF4, and CF5. For example, the light blocking pattern 155 may be a metal such as tungsten.

Figure 4:
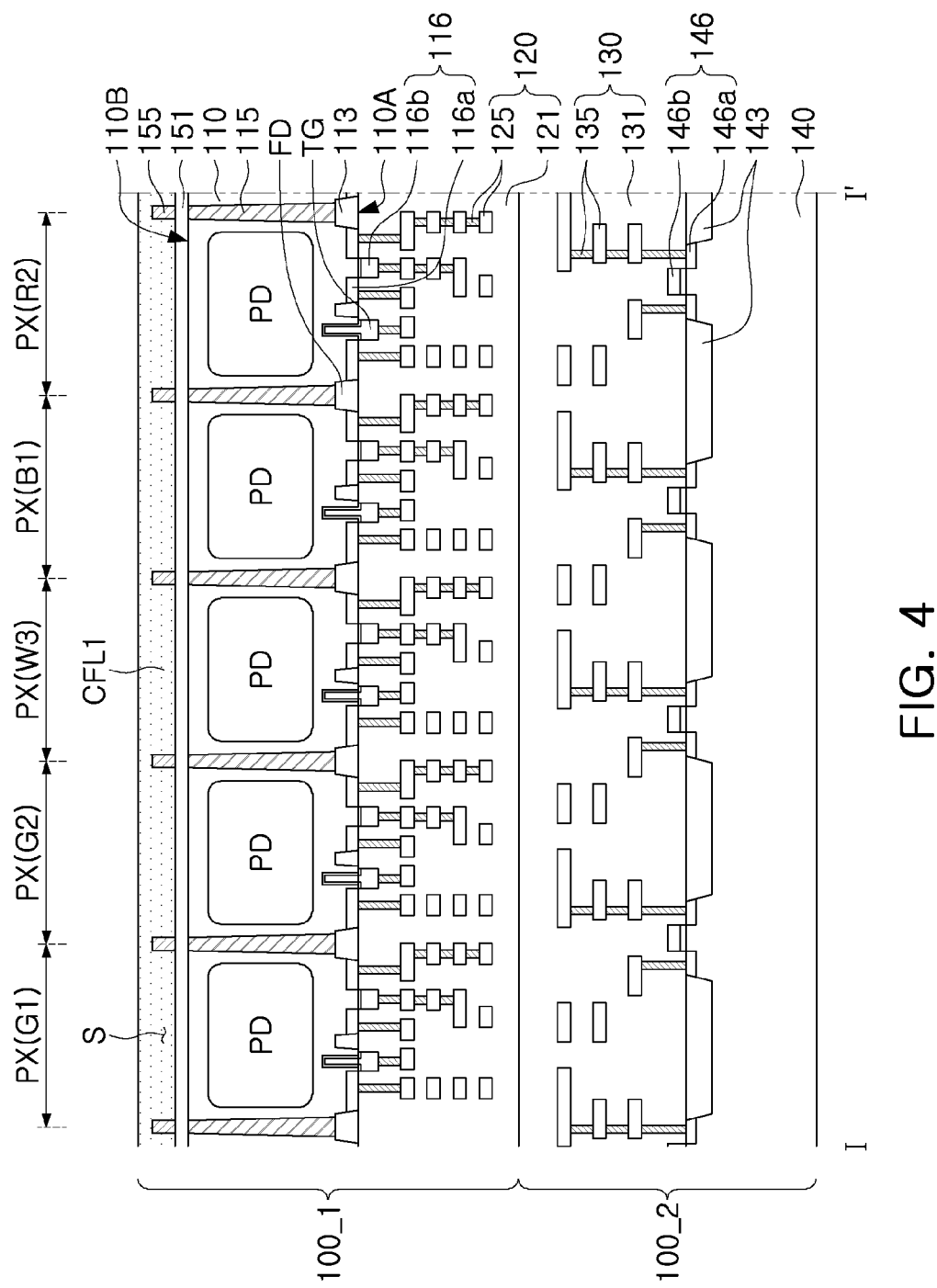

Next, referring to FIG. 4, a first color filter layer CFL1 may be formed to fill spaces S defined by the light blocking pattern 155. The first color filter layer CFL1 may be formed by a coating process such as spin coating to fill the spaces S. The first color filter layer CFL1 is a material for a white color filter structure, and may be transparent. The first color filter layer CFL1 may not include any filter material (such as a dye or pigment), but is not limited thereto. The first color filter layer CFL1 may include a filter material transmitting white light. For example, such a filter material may be a photosensitive resin layer having a dye or pigment having a color filter function.

Next, the first color filter layer CFL1 may be patterned. The patterning process of the first color filter layer CFL1 may be performed by a photolithographic process including exposure and development of a photoresist layer using a first mask M1 (as a photolithography mask, also referred to as a photomask) illustrated in FIGS. 5A and 5B. FIG. 5B is an enlarged view of part A of FIG. 5A. The photoresist layer may be patterned using the photolithography process and used to selectively etch (and pattern) the first color filter layer CFL1. For example, the pattern of the first mask M1 may be transferred to the first color filter layer CFL1 by forming a photoresist layer on the first color filter layer CFL1 and selectively exposing the photoresist layer using the first mask M1 as a mask. The photoresist layer may be developed (e.g., washed with a developer) to create a photoresist pattern corresponding to the pattern of the first mask M1. In a negative photoresist development, the photoresist pattern is formed by removing those portions that were not exposed to light so that those portions that were exposed to light remain. Alternatively, a positive photoresist development process may be used where the photoresist pattern is formed by removing those portions that were exposed to light so that those portions that were not exposed to light remain. The photoresist pattern may then be used to selectively etch the layer below the photoresist pattern (such as the first color filter layer CFL1) to remove the portions exposed by photoresist pattern. In some examples, the photoresist pattern selectively etches a hard mask layer on which it is formed (e.g., previously deposited on the first color filter layer CFL1) to form a hard mask, and this hard mask is then used to selectively etch the first color filter layer CFL1. This selective etching of a color filter layer using photolithography may be used with respect to the formation of other color filter layers described herein and need not be repeated.

Figure 5A:
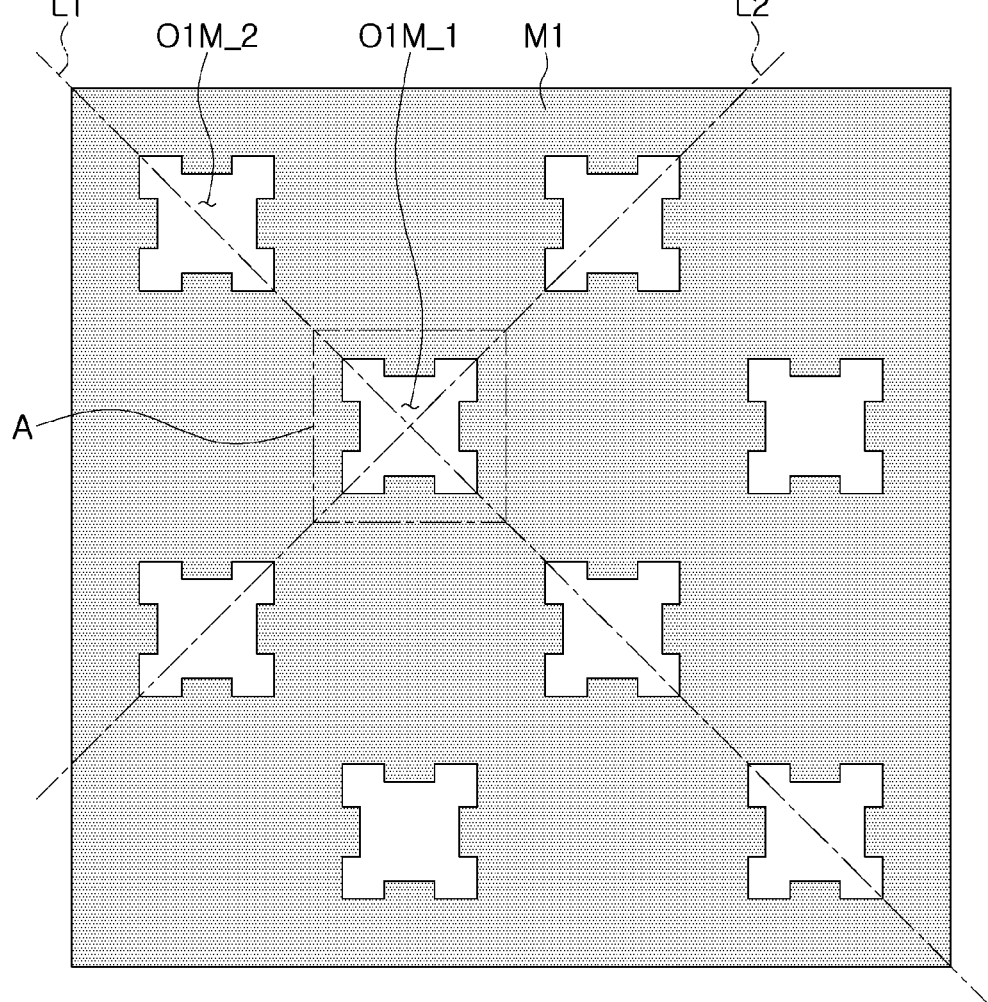
Figure 5B:
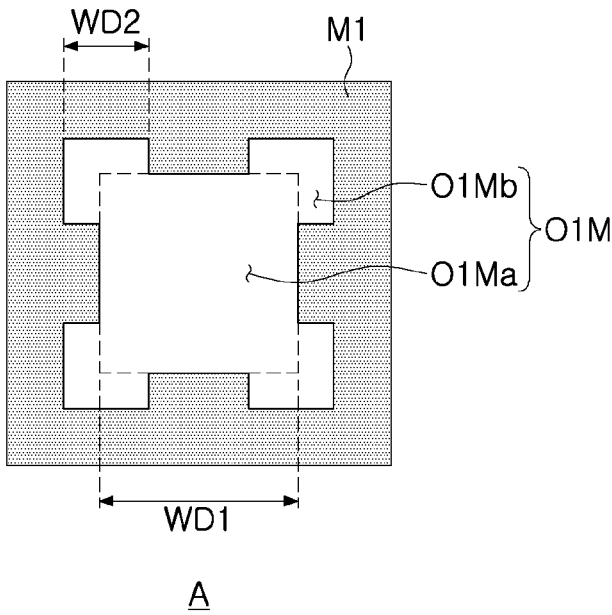

As illustrated in FIG. 5A, the first mask M1 may include a plurality of first patterns O1M (including O1M_1 and O1M_2). All the first patterns O1M may be formed in the same shape. Interior first patterns O1M (those first patterns not adjacent an edge of the first mask M1) have each of their corners adjacent a corner of another one of the first patterns O1M. For example, first pattern O1M_1 is shown in FIG. 5A as having its upper left corner adjacent the lower right corner of first pattern O1M_2 with the other corners of first pattern O1M_1 being adjacent to other corners of other first patterns O1M. Accordingly, the plurality of first patterns O1M that are immediately adjacent to each other may be arranged in diagonal straight lines (e.g., L1 and L2) connecting respective corners of the first patterns O1M disposed in diagonal directions. Accordingly, the color filter formed using the first mask M1 may have the above-described symmetrical arrangement.

Figure 6A:
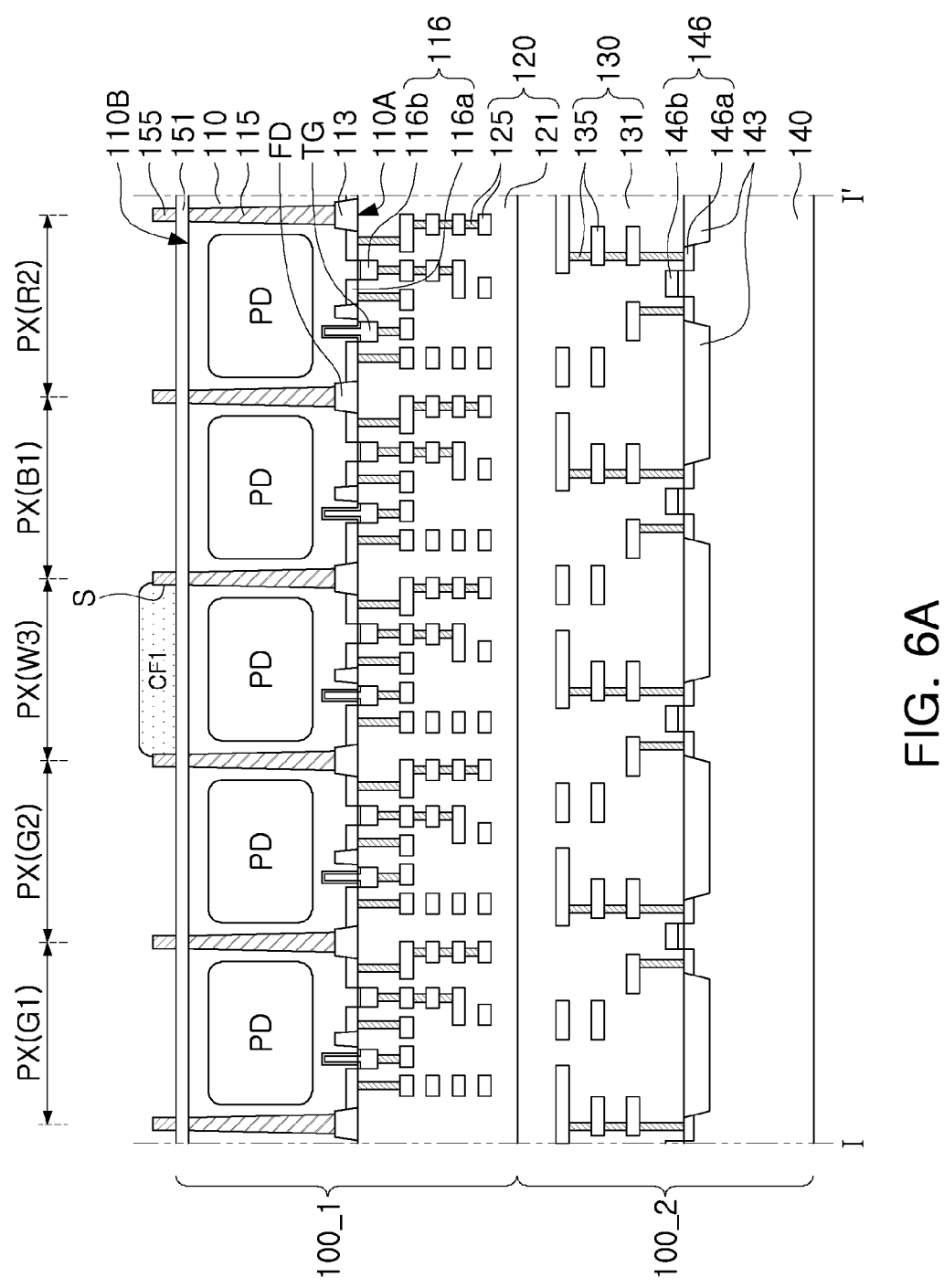
Figure 6B:
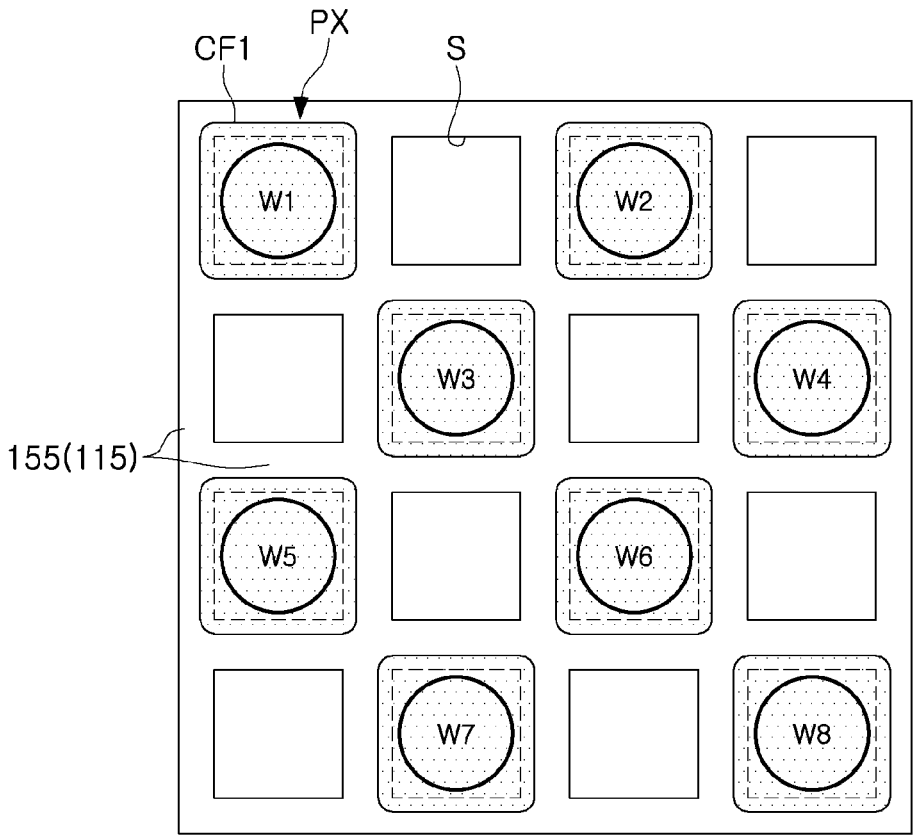

Referring to FIG. 5B, the first pattern O1M may include a rectangular main pattern O1Ma and sub-patterns O1Mb each extending from a corresponding corner of the main pattern O1Ma outwardly. A width WD2 of the sub pattern O1Mb may be smaller than a width WD1 of the main pattern O1Ma. In general, in a lithography and patterning process of forming a pattern by transferring a mask pattern onto a color filter layer, a problem in that a corner portion of the formed color filter is formed in a rounded shape may occur due to an optical proximity effect of irradiated light. That is, a problem may occur in that the shape of the mask and the actually formed color filter are different from each other. The sub-pattern O1Mb disposed at each corner of the main pattern O1Ma may expand light irradiated at each corner of the main pattern 0O1Ma externally, so that the correspondingly formed corner portion of the color filter has less of a rounded shape. After such a patterning process is performed, as shown in FIGS. 6A and 6B, a white color filter structure CF1 may be formed in the space S of the pixel region PX.

Figure 7:
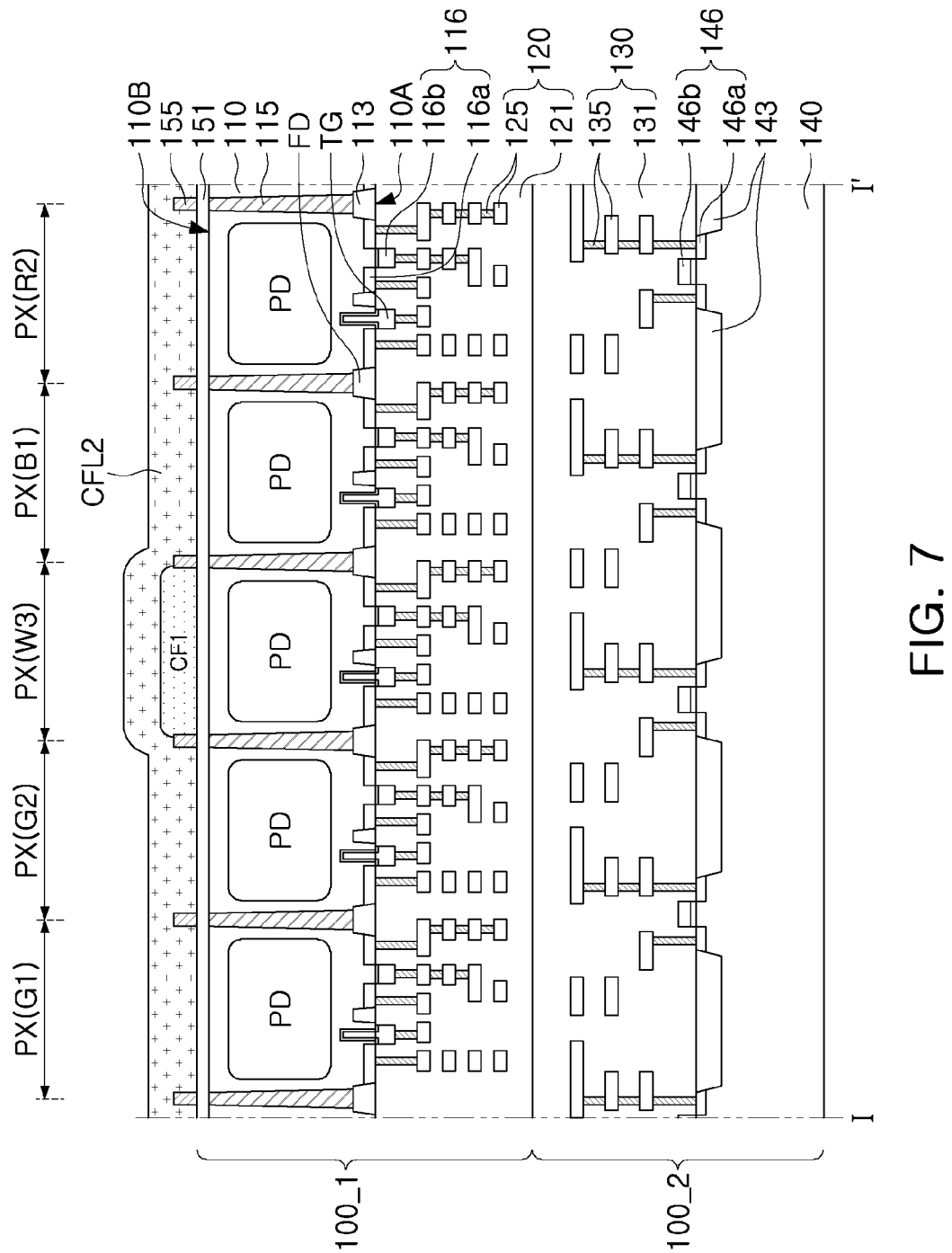

Next, referring to FIG. 7, a second color filter layer CFL2 may be formed to cover the white color filter structure CF1 and fill remaining ones of the spaces S defined by the light blocking pattern 155. Similar to the first color filter layer CFL1, the second color filter layer CFL2 may be formed by a coating process such as spin coating. The second color filter layer CFL2 is a material for a green color filter, and may include a filter material (e.g., pigment or dye) transmitting green light (and may block light of other colors).

Next, the second color filter layer CFL2 may be patterned. The patterning process of the second color filter layer CFL2 may be performed by a photolithographic process including exposure and development, and a second mask M2 illustrated in FIGS. 8A and 8B may be used as a photolithography mask. FIG. 8B is an enlarged view of part B of FIG. 8A.

Figure 8A:
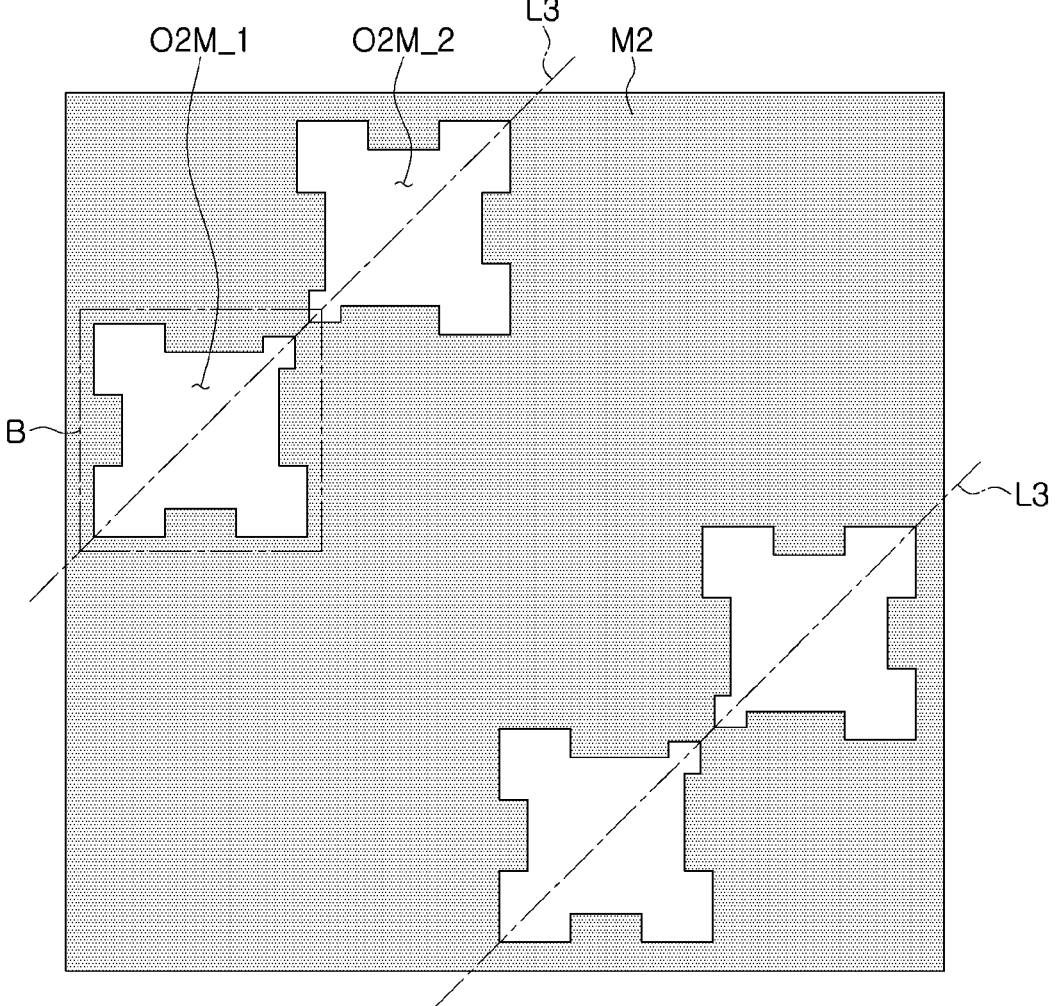
Figure 8B:
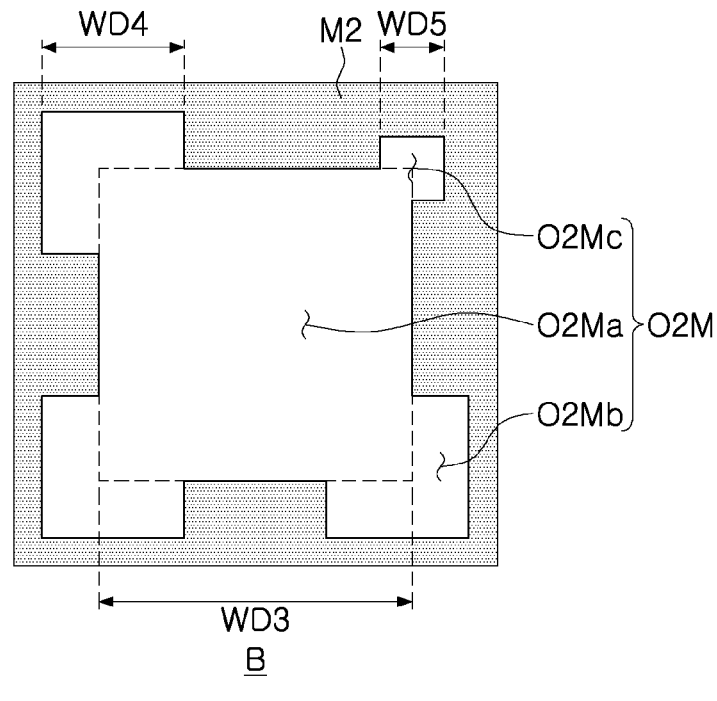

As illustrated in FIG. 8A, the second mask M2 may include a plurality of second patterns O2M (including O2M_1 and O2M_2). The arrangement of the second patterns O2M may be such that only one or two corners of any one second pattern O2M is disposed adjacently to a corner of another second pattern O2M. As shown, each of the patterns O2M in FIG. 8A only have a single corner disposed adjacent to a corner of another second pattern O2M. That is, unlike the first patterns O1M_1 and O1M_2 of the first mask M1 described above, The second patterns O2M of the second mask M2 that are immediately adjacent each other may be arranged in a line only along corresponding one of diagonal straight lines L3 extending in one direction connecting corners. Accordingly, the color filter formed using the second mask M2 may have the above-described asymmetrical arrangement.

Referring to FIG. 8B, the second pattern O2M may include a rectangular (e.g., square) main pattern O2Ma and sub-patterns O2Mb and O2Mc extending from corners of the main pattern O2Ma outwardly. The sub-patterns O2Mb and O2Mc may have a rectangular (e.g., square) shape that is superposed (overlaps) the main pattern O2Ma. The sub-patterns may include a first sub-pattern O2Mb and a second sub-pattern O2Mc. The second sub-pattern O2Mc may be disposed at a corner immediately adjacent to another second pattern O2M in the diagonal direction (see FIG. 8A), and the first sub-patterns O2Mb may be disposed at the remaining corners of the main pattern O2Ma in which a second sub-pattern O2Mc is not disposed (i.e., the first sub-patterns O2Mb may be disposed at corners of the main pattern O2Ma that are not immediately adjacent to another second pattern O2M. A width WD4 of the first sub-pattern O2Mb and a width WD5 of the second sub-pattern O2Mc may be smaller than a width WD3 of the main pattern O2M. For example, the width WD4 of the first sub-pattern O2Mb may be formed in a range exceeding 0.05 times and less than 0.5 times the width WD3 of the main pattern O2Ma. In addition, a width WD5 of the second sub-pattern O2Mc may be narrower than the width WD4 of the first sub-pattern O2Mb. According to an example embodiment, the width WD3 of the main pattern O2Ma of the second pattern O2M may be greater than the width WD1 of the main pattern O1Ma of the first pattern O1M described above. In addition, according to an example embodiment, the width WD4 of the first sub-pattern O2Mb of the second pattern O2M may be greater than the width WD2 of the sub-pattern O1Mb of the first pattern O1M. In addition, according to an example embodiment, the width WD4 of the second sub-pattern O2Mb of the second pattern O2M may be narrower than the width WD2 of the sub-pattern O1Mb of the first pattern O1M.

As described above, the sub-pattern acts to reduce the rounding of a corner portion of the color filter being formed, but when an asymmetrically arranged color filter is formed, a defect in which corners of color filters, adjacent to each other, are connected to each other may occur. As described above, when the color filters are connected, a problem of increasing deviation of light emitted from adjacent color filters of different colors may occur. In particular, the green color filters connected to each other may increase deviation of white light emitted from the white color filter structures. In an example embodiment, each corner of the green color filters may be uniform by making the size of the second sub-pattern O2Mc smaller than the size of the first sub-pattern O2Mb with similar adjustments made to other color filters/color filter structures as appropriate (e.g., such as based on their arrangement). Accordingly, the problem that asymmetrically arranged color filters are connected to each other may be addressed.

Figure 8C:
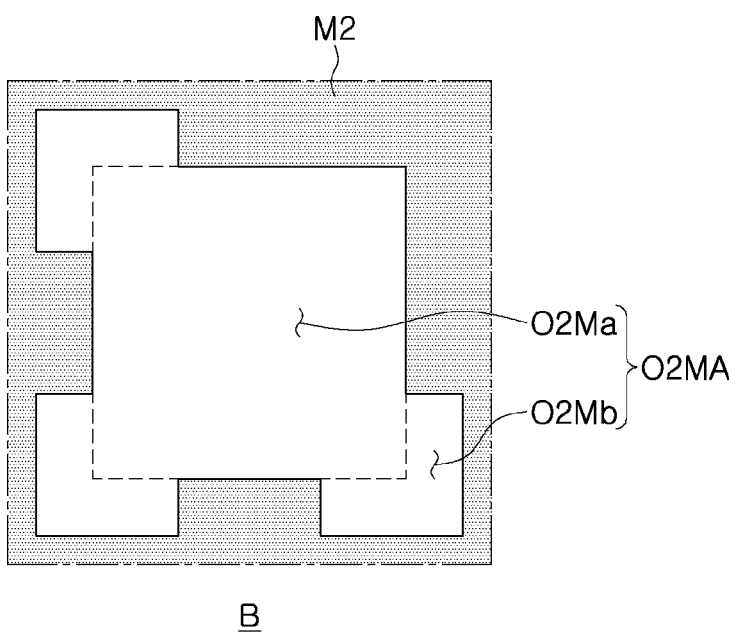
Figure 8D:
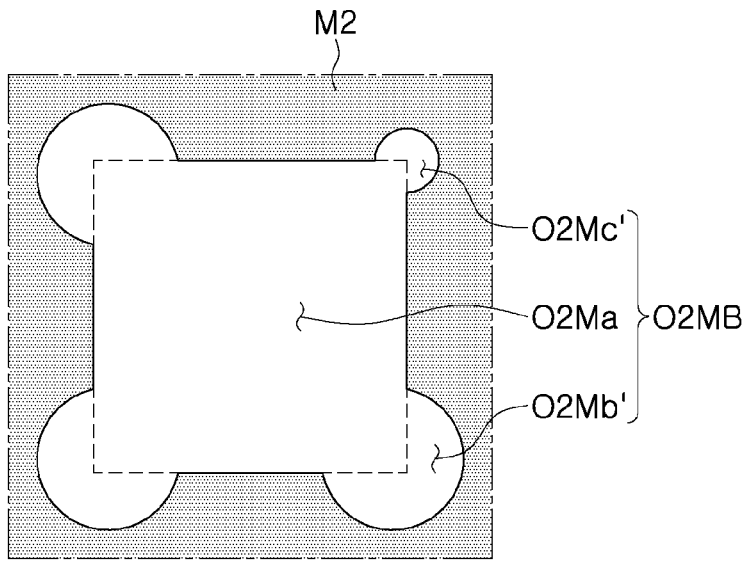

The first sub-pattern O2Mb and the second sub-pattern O2Mc and the second sub-pattern O2Mc may be variously modified within a limit that is smaller than the size of the first sub-pattern O2Mb. As shown in FIG. 8C, the second sub-pattern may not be formed in some example embodiments. In addition, as shown in FIG. 8D, the first sub-pattern O2Mb' and the second sub-pattern O2Mc' of the second pattern O2MB may be formed in different shapes, such as a circular shape or other elliptical shape.

Figure 9A:
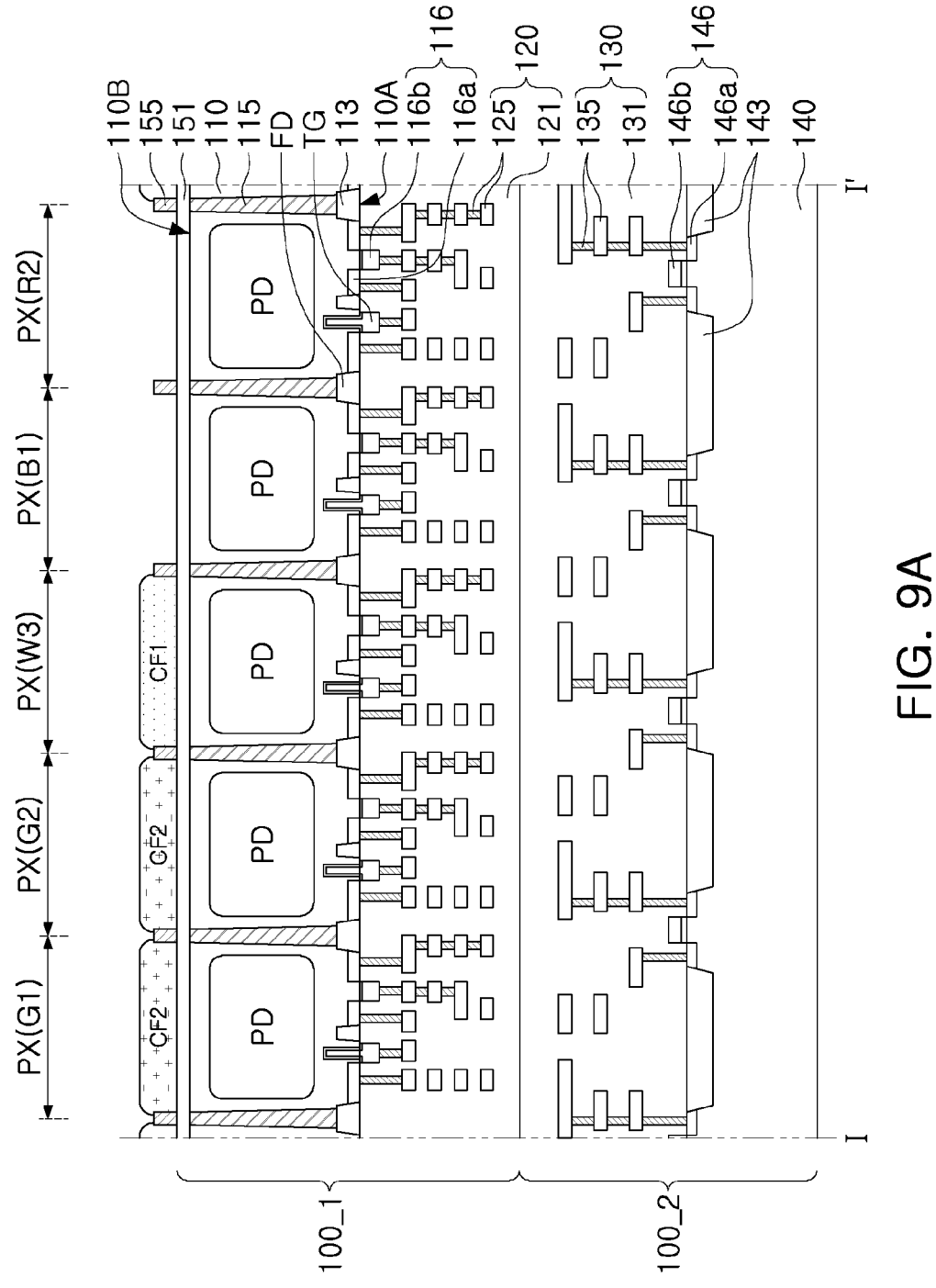
Figure 9B:
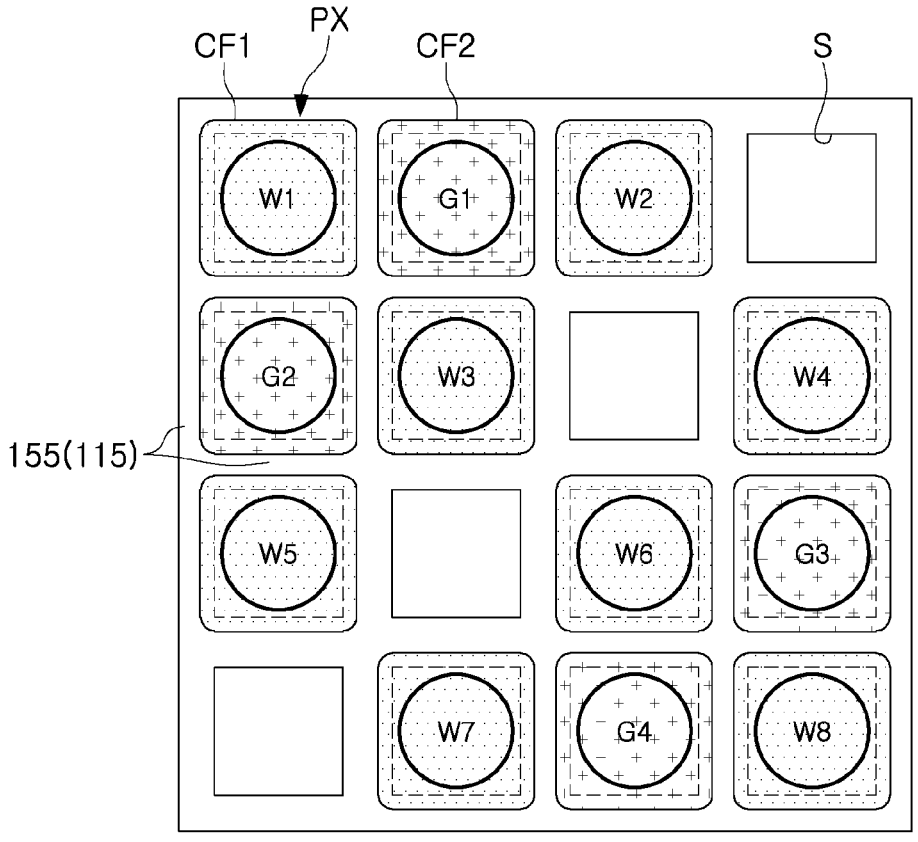
Figure 9C:
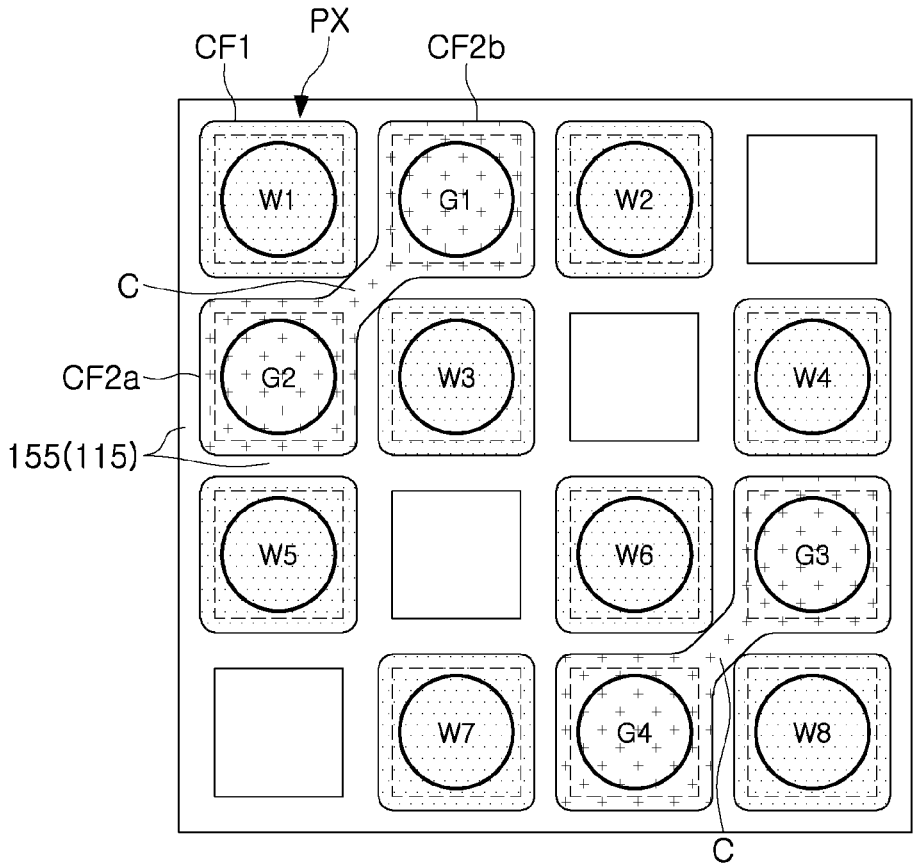

In general, in a process of forming a pattern by transferring a mask pattern to a color filter layer, due to an optical proximity effect of light irradiated to the color filter layer, a problem in which a corner portion of the transferred pattern is formed in a rounded shape may occur. That is, the pattern actually formed on the color filter layer and the corresponding shape of the mask may be different from each other. The sub-pattern O1Mb disposed at each corner of the main pattern O1Ma may reduce of the rounding of the corners of the transferred pattern formed on the color filter layer. After such a patterning process is performed, as illustrated in FIGS. 9A and 9B, a green color filter CF2 may be formed in a space S of the pixel region PX. Referring to FIG. 9B, it can be seen that the asymmetrically arranged green color filters CF2 are separated while not being connected to each other. FIG. 9C is a diagram illustrating a color filter formed by using a mask in which sub-patterns of the same size are disposed at each corner of the main pattern, as a Comparative Example. It can be seen that a connection portion C is formed between the asymmetrically arranged green color filters CF2a and CF2b.

Figure 10:
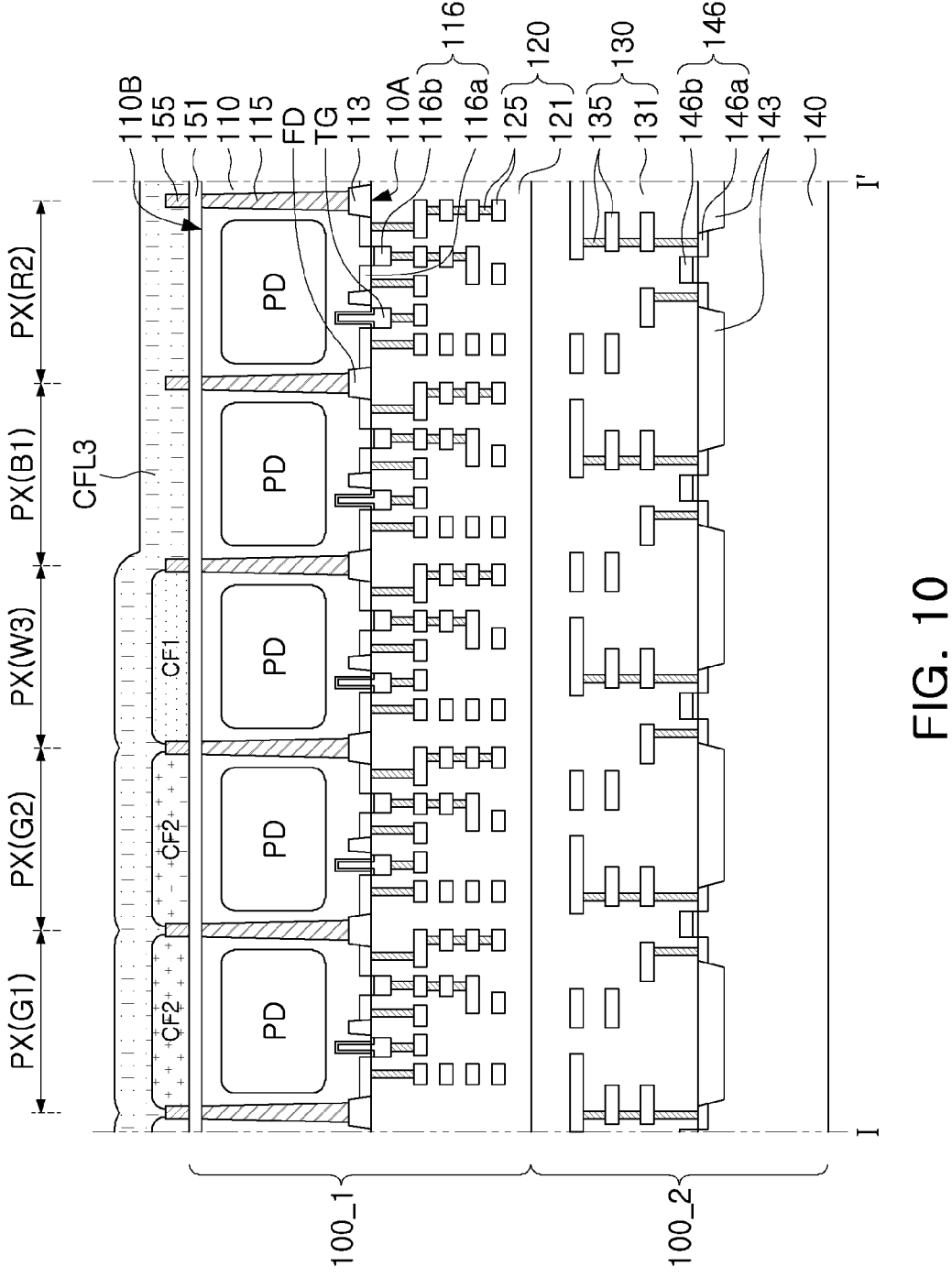
Figure 11:
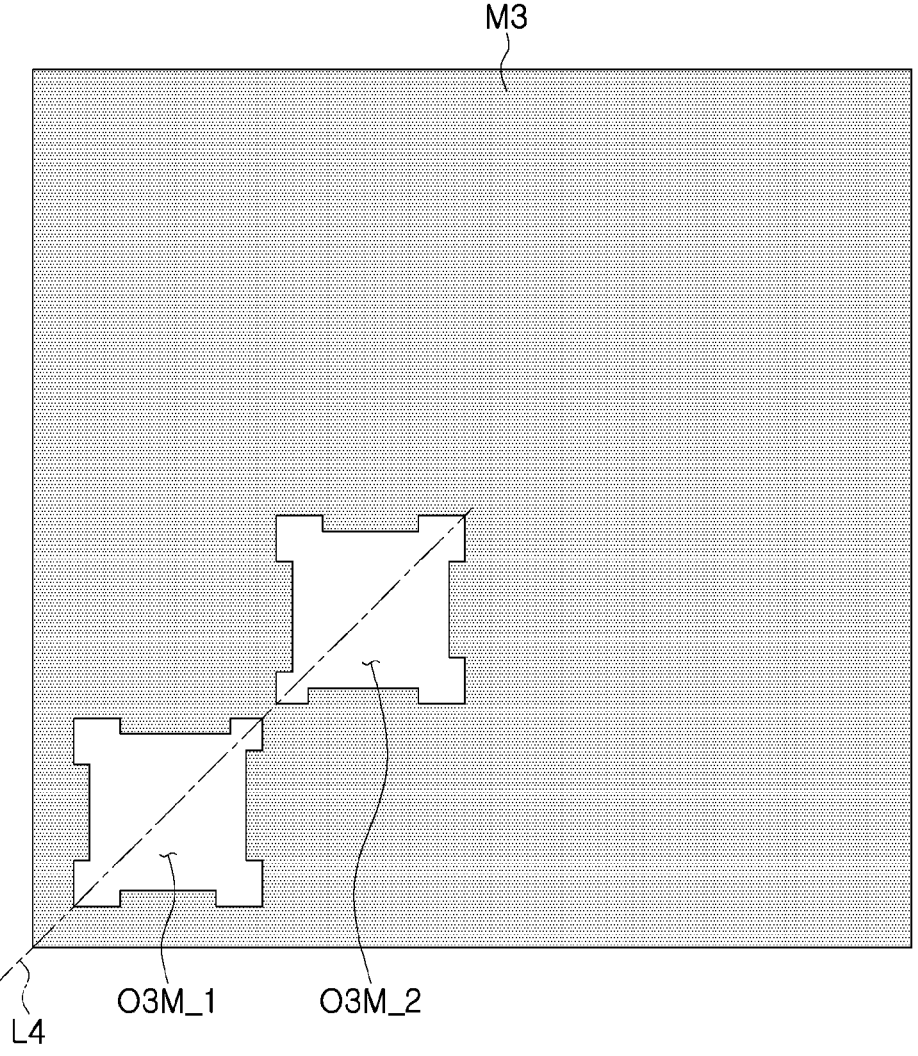
Figure 12:
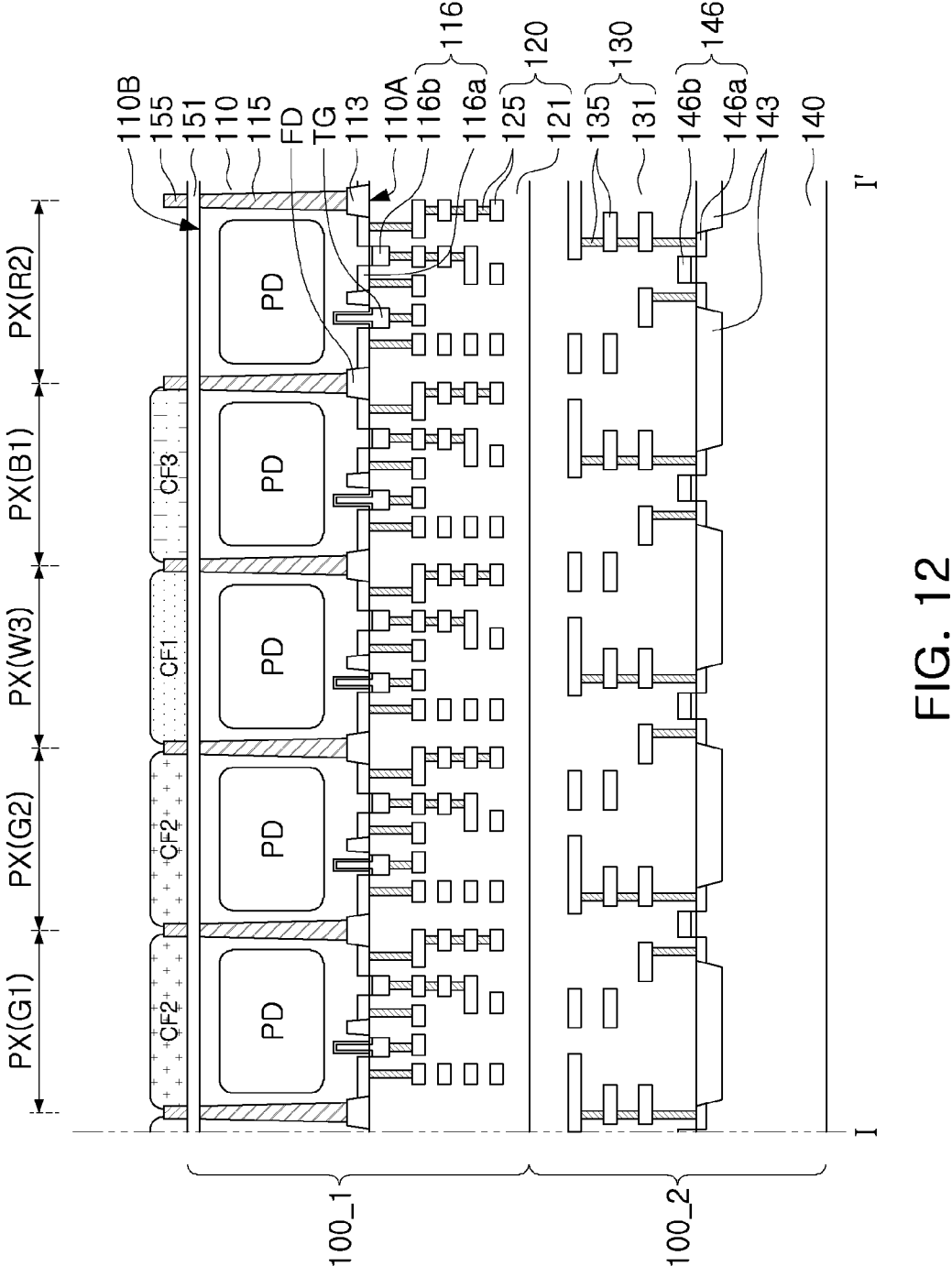

Next, referring to FIG. 10, a third color filter layer CFL3 may be formed to cover a white color filter structure CF1 and a green color filter CF2 and so that remaining ones of spaces S are filled. Similar to the patterning process of the second color filter layer CFL2 described above, as illustrated in FIG. 11, when a photolithographic process including exposure and development are performed using a third mask M3 including a plurality of third patterns O3M (including O3M_1 and O3M_2), as illustrated in FIG. 12, a blue color filter CF3 may be formed. The plurality of third patterns O3M of the third mask M3 that are immediately adjacent to each other may be arranged in a corresponding one of diagonal straight lines L4 (one shown) connecting corners, respectively disposed in the same diagonal direction. The third patterns O3M may not be disposed immediately adjacent to each other with respect to other diagonal directions (thus, diagonal straight lights disposed in different directions than L4 would not connect corners of third patterns O3M that are immediately adjacent to each other).

Figure 13:
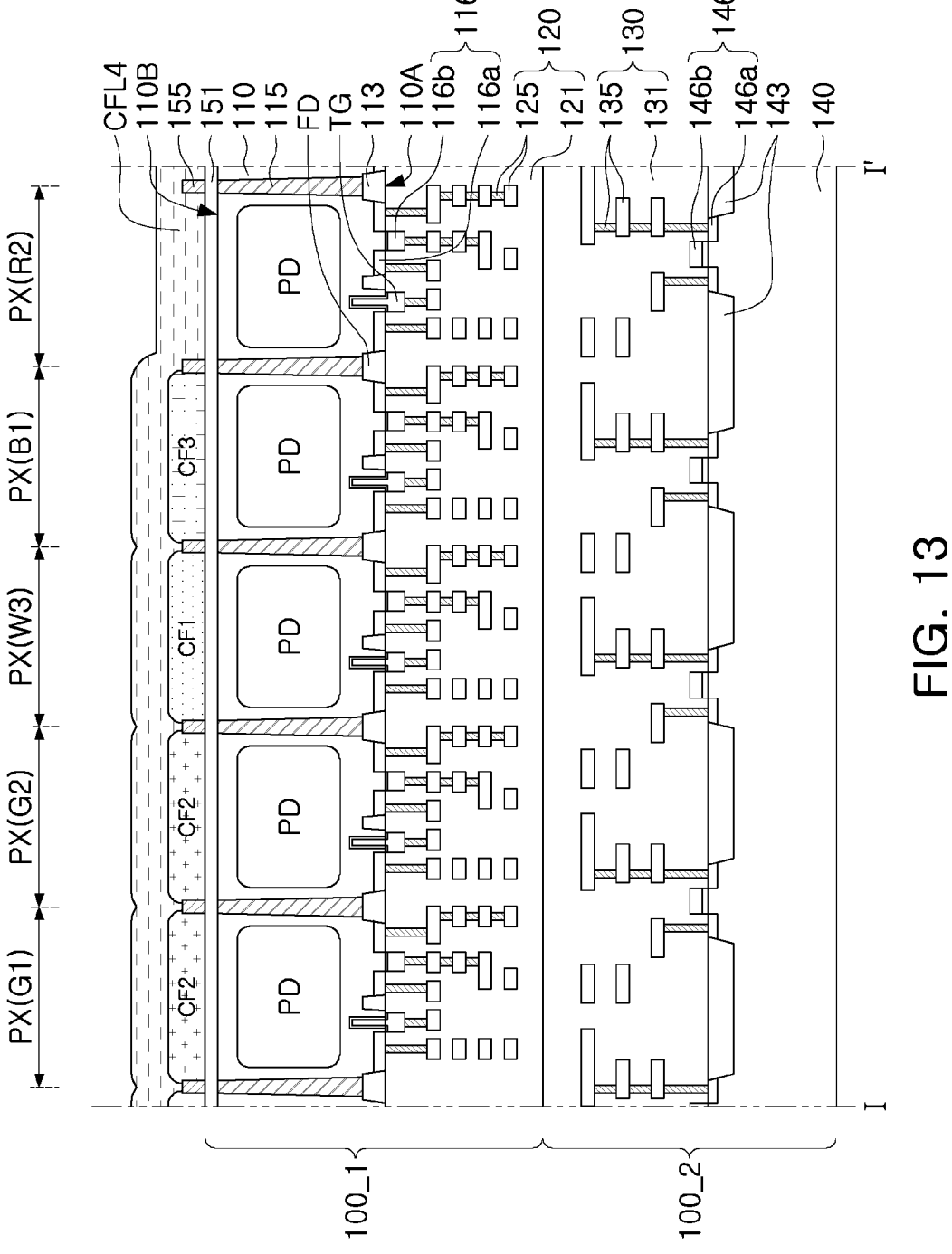
Figure 14:
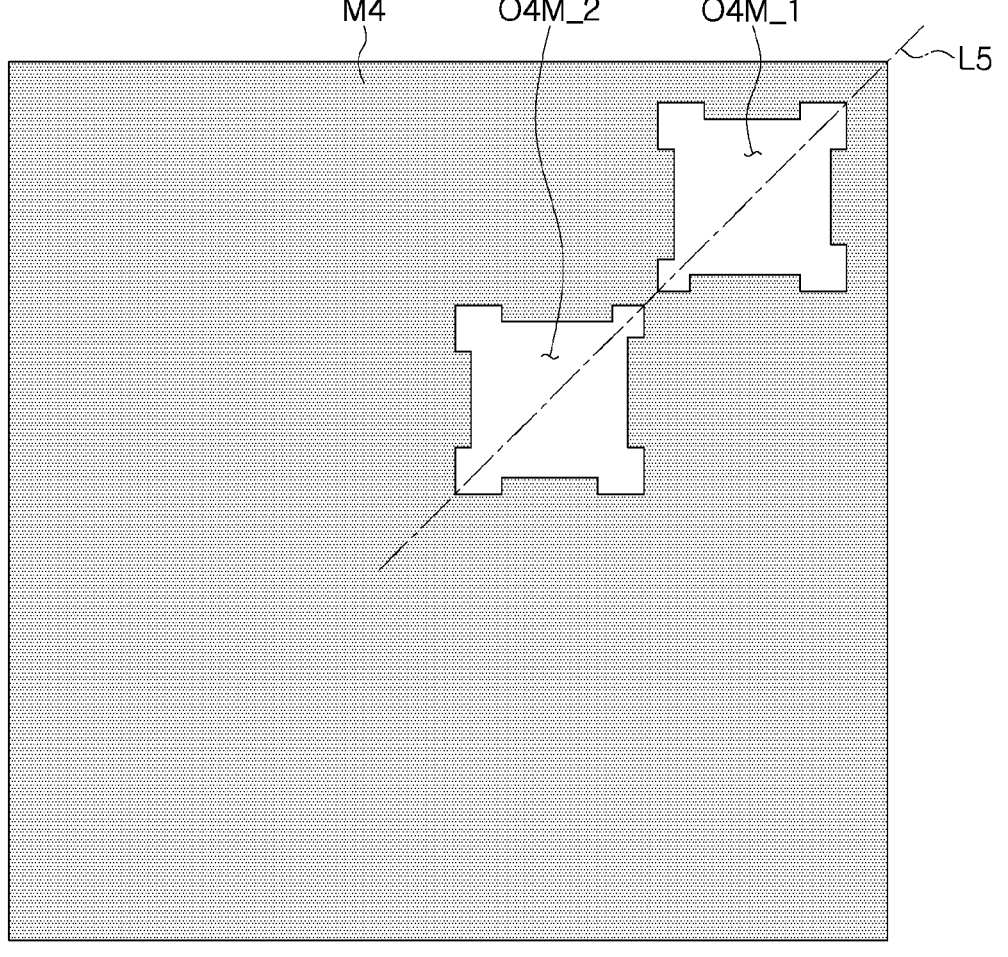
Figure 15:
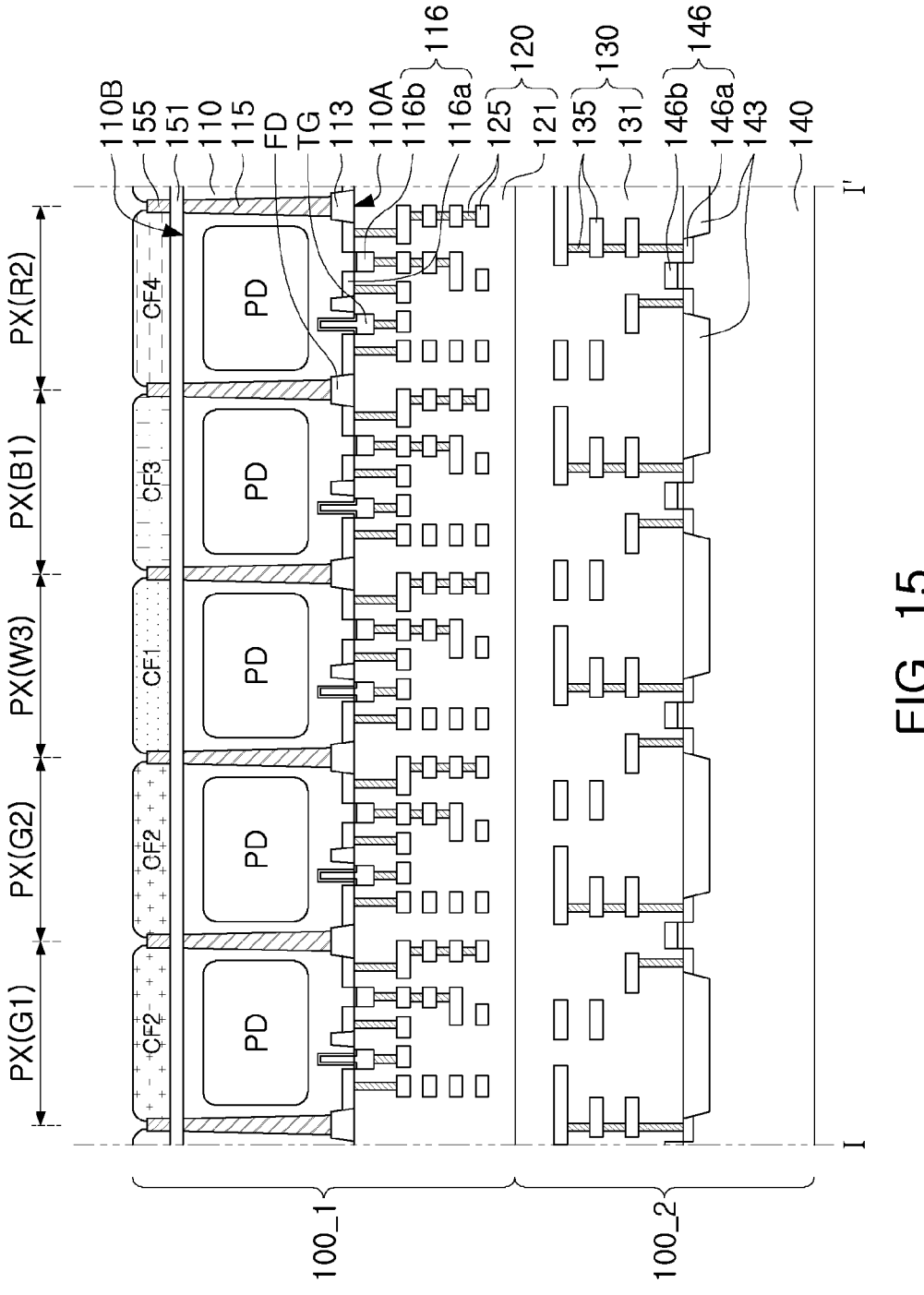

Next, referring to FIG. 13, a fourth color filter layer CFL4 may be formed to cover the white color filter structure CF1, the green color filter CF2, and the blue color filter CF3 to fill remaining ones of spaces S. Similar to the patterning process of the third color filter layer CFL3 described above, as illustrated in FIG. 14, a photolithographic process including exposure and development are performed using a fourth mask M4 including a plurality of fourth patterns O4M (including O4M_1 and O4M_2), as illustrated in FIG. 13, a red color filter CF4 may be formed. The plurality of fourth patterns O4M of the fourth mask M4 may be arranged along a corresponding one of diagonal straight lines L5 (only one being shown) connecting corners of fourth patterns O4M that are immediately adjacent to each other, the diagonal straight lines L5 being disposed in the same diagonal direction.

Figure 16:
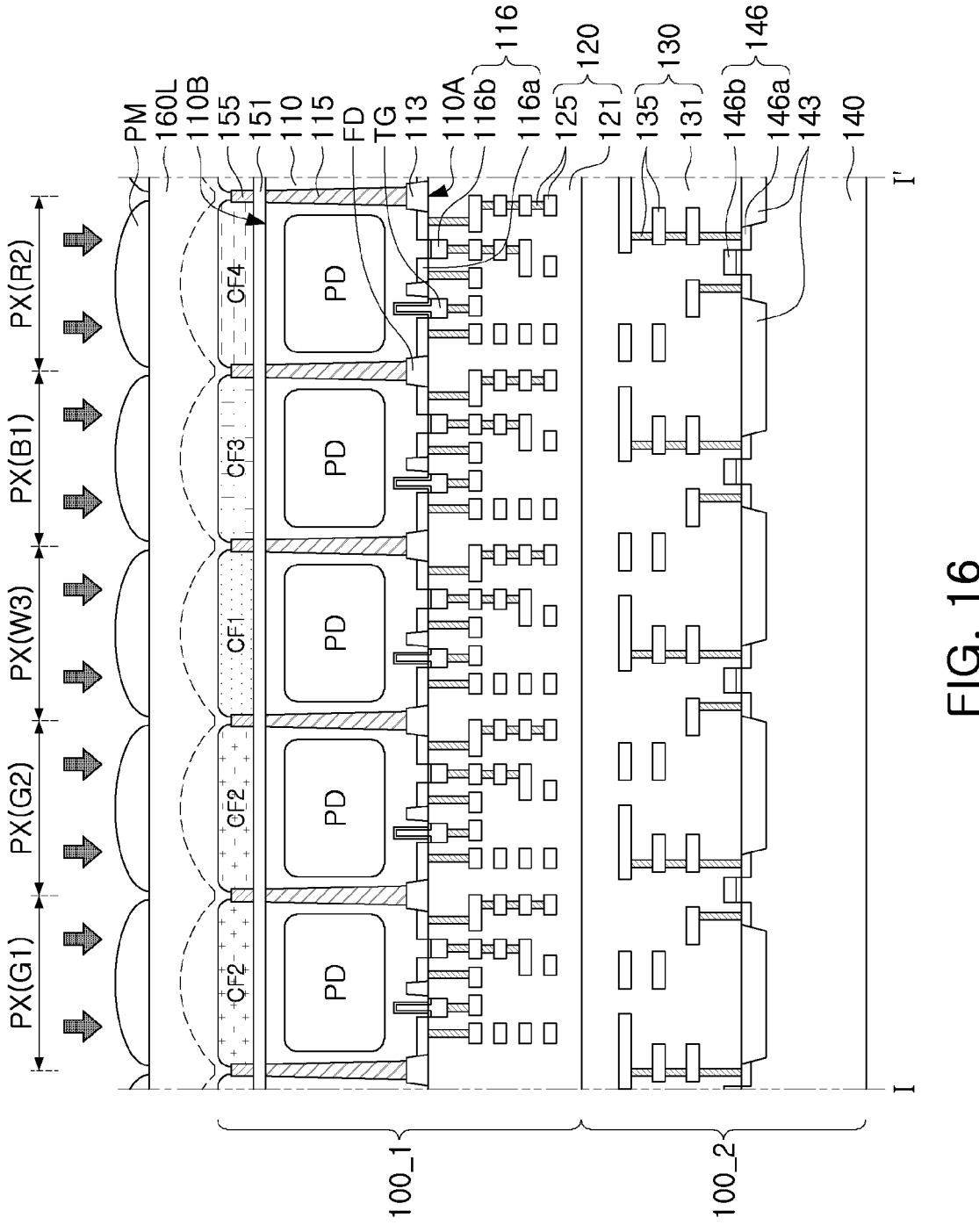

Next, referring to FIG. 16, a lens material layer 160L may be formed on the first to fourth color filter structures CF1, CF2, CF3 and CF4, and then sacrificial patterns PM having a desired lens shape may be formed on the lens material layer 160L. For example, the lens material layer 160L may be a transparent resin having excellent light transmittance. The lens material layer 160L may be formed to have a substantially flat upper surface. The sacrificial patterns PM are disposed on the lens material layer 160L, and may be processed to have a desired lens shape in each pixel region PX. A process of forming the sacrificial patterns PM may be performed by patterning after forming the sacrificial material layer to form the sacrificial patterns PM, and reflow to have a lens shape. Then, by performing an etching process of the lens material layer 160L together with the sacrificial patterns PM, a shape of the sacrificial patterns PM may be transferred to the lens material layer 160L. This etching process may be performed until the sacrificial patterns PM are removed, and a microlens layer 160 indicated by a dotted line may be formed.

As set forth above, according to the present inventive concept, it is possible to provide a manufacturing method of an image sensor in which color filters disposed adjacently to each other are not connected to each other, so that deviation of light received by the color filters is reduced.

The various and advantageous advantages and effects of the present inventive concept are not limited to the above description, and may be more easily understood in the course of describing a specific embodiment of the present inventive concept.

While example embodiments have been shown and described above, it will be apparent to those skilled in the art that modifications and variations could be made without departing from the scope of the present inventive concept as defined by the appended claims.

What is claimed is:

1. A manufacturing method of an image sensor, comprising the steps of:
preparing a substrate including a plurality of pixel regions arranged in a matrix, each pixel region having a photodetector;
forming a color filter layer on the substrate; and
patterning the color filter layer using a photolithography mask to form first color filters for some of the plurality of pixel regions on the substrate,
wherein the mask includes patterns respectively corresponding to the first color filters, the patterns including a first pattern and a second pattern disposed immediately adjacent to each other in a diagonal direction with respect to the matrix,
wherein each of the patterns includes a rectangular main pattern and sub-patterns extending outwardly from each corner of the main pattern,
wherein the sub-patterns include first sub-patterns and second sub-patterns, and
wherein corners of the first pattern and corners of the second pattern comprise first corners that do not face each other and second corners that face each other,
wherein the first corners comprise first sub-patterns and the second corners comprise second sub-patterns, and
wherein the second sub-patterns are smaller than the first sub-patterns.

2. The manufacturing method of an image sensor of claim 1, wherein the second sub-patterns facing each other are disposed on a straight line arranged in a diagonal direction with respect to the matrix.

3. The manufacturing method of an image sensor of claim 1,
wherein the plurality of pixel regions comprise red pixels, green pixels, blue pixels, and white pixels, and
wherein the first color filters are any one of red color filters, green color filters, and blue color filters.

4. The manufacturing method of an image sensor of claim 1, wherein the first and second sub-patterns have a shape of any one of a square, a rectangle, an ellipse and a circle.

5. The manufacturing method of an image sensor of claim 1,
wherein each of the first pattern and the second pattern include three first corners comprising the first sub-patterns and one second corner comprising the second sub-pattern.

6. The manufacturing method of an image sensor of claim 1, wherein a width of the first sub-pattern is in a range of exceeding 0.5 times and less than 0.5 times a width of the main pattern.

7. The manufacturing method of an image sensor of claim 1, wherein a shape of the main pattern is different from a shape of the first and second sub-patterns.

8. The manufacturing method of an image sensor of claim 1, wherein the color filter layer is a photosensitive resin layer.

9. A manufacturing method of an image sensor, comprising the steps of:
preparing a substrate including a plurality of pixel regions arranged in a matrix, each pixel region having a photodetector;
forming a first color filter layer on the substrate;
patterning the first color filter layer using a first photolithography mask, to form first color filter structures corresponding to a first group of the plurality of pixel regions on the substrate;
forming a second color filter layer covering the first color filter structures on the substrate; and
patterning the second color filter layer using a second photolithography mask, to form second color filter structures corresponding to a second group of the plurality of pixel regions on the substrate,
wherein the first photolithography mask includes first patterns disposed in a region respectively corresponding to the first color filters, and the second photolithography mask includes second patterns disposed in a region respectively corresponding to the second color filters,
wherein at least one first pattern, among the first patterns, has each of its corners disposed immediately adjacent, in a corresponding diagonal direction of the matrix, to a corner of another corresponding one of the first patterns,
wherein the second patterns comprise a pair of immediately adjacent second patterns having corners facing each other in a corresponding diagonal direction of the matrix,
wherein each of the first patterns comprises a first main pattern and sub-patterns extending outwardly from each corner of the first main pattern and each of the second patterns comprises a second main pattern and sub-patterns extending outwardly from each corner of the second main pattern, the first and second main patterns having a rectangular shape, and
wherein the facing corners of the pair of immediately adjacent second patterns have sub-patterns that have a size that is smaller than a size of at least some of the sub-patterns of the first patterns.

10. The manufacturing method of an image sensor of claim 9, wherein the first color filter structures and the second color filter structures are color filters having different colors from each other.

11. The manufacturing method of an image sensor of claim 9,
wherein the second color filter structures are any one of red color filters, green color filters, and blue color filters.

12. The manufacturing method of an image sensor of claim 11, wherein the first color filters and the second color filters form part of an RGBW-Kodak pattern.

13. The manufacturing method of an image sensor of claim 9, wherein the first main patterns have the same shape as the second main patterns.

14. The manufacturing method of an image sensor of claim 13, wherein the size of the second main patterns are larger than the size of the first main patterns.

15. The manufacturing method of an image sensor of claim 9,
wherein the size of the sub-patterns of the pair of immediately adjacent second patterns of corners excluding the corners facing each other is greater than the size of the sub-patterns of the first pattern.

16. The manufacturing method of an image sensor of claim 9, wherein the forming of the second color filter structures is performed after the forming the first color filter structures.

17. The manufacturing method of an image sensor of claim 9, wherein the number of the first color filter structures of the image sensor is greater than the number of the second color filter structures.

18. The manufacturing method of an image sensor of claim 9, wherein the first color filter structures have substantially the same size as the second color filter structures.

19. A manufacturing method of an image sensor, comprising the steps of:
forming a color filter layer over a plurality of pixel regions having a plurality of photodetectors that are arranged in a matrix on a substrate; and
patterning the color filter layer with a photolithography mask including patterns disposed adjacently in a diagonal direction of the matrix, to form color filters at corresponding to ones of the plurality of pixel regions on the substrate,
wherein each of the patterns includes rectangular main patterns and sub-patterns outwardly extending from each corner of the main patterns, and
wherein the patterns comprise a pair of immediately adjacent patterns having corners facing each other that are the corners of the corresponding main patterns or have sub-patterns having a size smaller than a size of other sub-patterns of the pair of immediately adjacent patterns other than the sub-patterns of the corners facing each other.

20. The manufacturing method of an image sensor of claim 19,
wherein the plurality of pixel regions comprise red pixels, green pixels, blue pixels, and white pixels, and
wherein the color filters are any one of red color filters, green color filters, and blue color filters.

* * * * *